United States Patent
Ap et al.

(10) Patent No.: US 12,366,899 B2
(45) Date of Patent: Jul. 22, 2025

(54) TRANSMISSION LINE EMBEDDED IN A PORTION OF A CHASSIS OF AN ELECTRONIC DEVICE

(71) Applicant: Intel Corporation, Santa Clara, CA (US)

(72) Inventors: Santhosh Ap, Karnataka (IN); Madhurkiran Sreenivasa Reddy, Bangalore (IN); Prakash Kurma Raju, Bangalore (IN); Prasanna Pichumani, Bangalore (IN); Vamshi Krishna Aagiru, Bangalore (IN); Nithesha Ananda, Karnataka (IN)

(73) Assignee: Intel Corporation, Santa Clara, CA (US)

( * ) Notice: Subject to any disclaimer, the term of this patent is extended or adjusted under 35 U.S.C. 154(b) by 787 days.

(21) Appl. No.: 17/484,145

(22) Filed: Sep. 24, 2021

(65) Prior Publication Data

US 2022/0026962 A1   Jan. 27, 2022

(51) Int. Cl.
*G06F 1/16* (2006.01)
*H05K 1/02* (2006.01)

(52) U.S. Cl.
CPC .......... *G06F 1/1683* (2013.01); *G06F 1/1656* (2013.01); *H05K 1/0243* (2013.01)

(58) Field of Classification Search
CPC .... G06F 1/1683; G06F 1/1656; G06F 1/1698; G06F 1/203; H05K 1/0243
See application file for complete search history.

(56) References Cited

U.S. PATENT DOCUMENTS

| | | | |
|---|---|---|---|
| 8,571,598 B2 * | 10/2013 | Valavi | A61B 5/002 455/456.6 |
| 10,854,957 B2 * | 12/2020 | Moon | H04M 1/026 |
| 11,600,904 B2 * | 3/2023 | Moon | H01Q 1/38 |
| 11,983,048 B2 * | 5/2024 | Choi | G06F 1/1637 |
| 12,046,801 B2 * | 7/2024 | Moon | H01Q 1/243 |
| 12,149,007 B2 * | 11/2024 | Choi | H01Q 21/062 |
| 2008/0146265 A1 * | 6/2008 | Valavi | A61B 5/002 455/550.1 |
| 2020/0266520 A1 * | 8/2020 | Moon | H04M 1/0249 |
| 2021/0083366 A1 * | 3/2021 | Moon | H01Q 1/243 |
| 2022/0026962 A1 * | 1/2022 | Ap | H05K 1/0243 |
| 2023/0015184 A1 * | 1/2023 | Choi | G06F 1/1656 |
| 2023/0018781 A1 * | 1/2023 | Choi | G06F 1/1698 |
| 2023/0238685 A1 * | 7/2023 | Moon | H01Q 9/0407 343/700 MS |
| 2024/0079782 A1 * | 3/2024 | Rush | H01Q 1/243 |

* cited by examiner

*Primary Examiner* — Anthony M Haughton
*Assistant Examiner* — Theron S Milliser
(74) *Attorney, Agent, or Firm* — Banner & Witcoff Ltd.

(57) ABSTRACT

Particular embodiments described herein provide for an electronic device that can be configured to include a substrate, a keyboard, and a chassis, where a portion of the chassis is between the substrate and the keyboard. A transmission line is embedded in the portion of the chassis between the substrate and the keyboard. In some examples, the portion of the chassis between the substrate and the keyboard that includes the transmission line is a support plate for the keyboard.

20 Claims, 9 Drawing Sheets

TRANSMISSION LINE EMBEDDED IN A PORTION OF A CHASSIS OF AN ELECTRONIC DEVICE

TECHNICAL FIELD

This disclosure relates in general to the field of computing, and more particularly, to a transmission line embedded in a portion of a chassis of an electronic device.

BACKGROUND

Emerging trends in systems place increasing performance demands on the system. One way to attempt to improve performance and function is to increase the density of the devices and systems and pack more computing elements into the devices and systems. The increasing performance demands can create a relatively crowded system as more and more components are located in close proximity to each. One particular component is the communication cable for wireless systems. If the cable has a small diameter in an attempt to reduce the Z-height of the system, increased insertion loss can occur resulting is the need for a higher transmit power that can cause radiating noise level increases in the system. If the cable has a relatively large diameter, then the system Z-height can be negatively impacted. The term "Z-height," "Z location," etc. refers to the height along the "Z" axis of an (x, y, z) coordinate axis or cartesian coordinate system.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1:
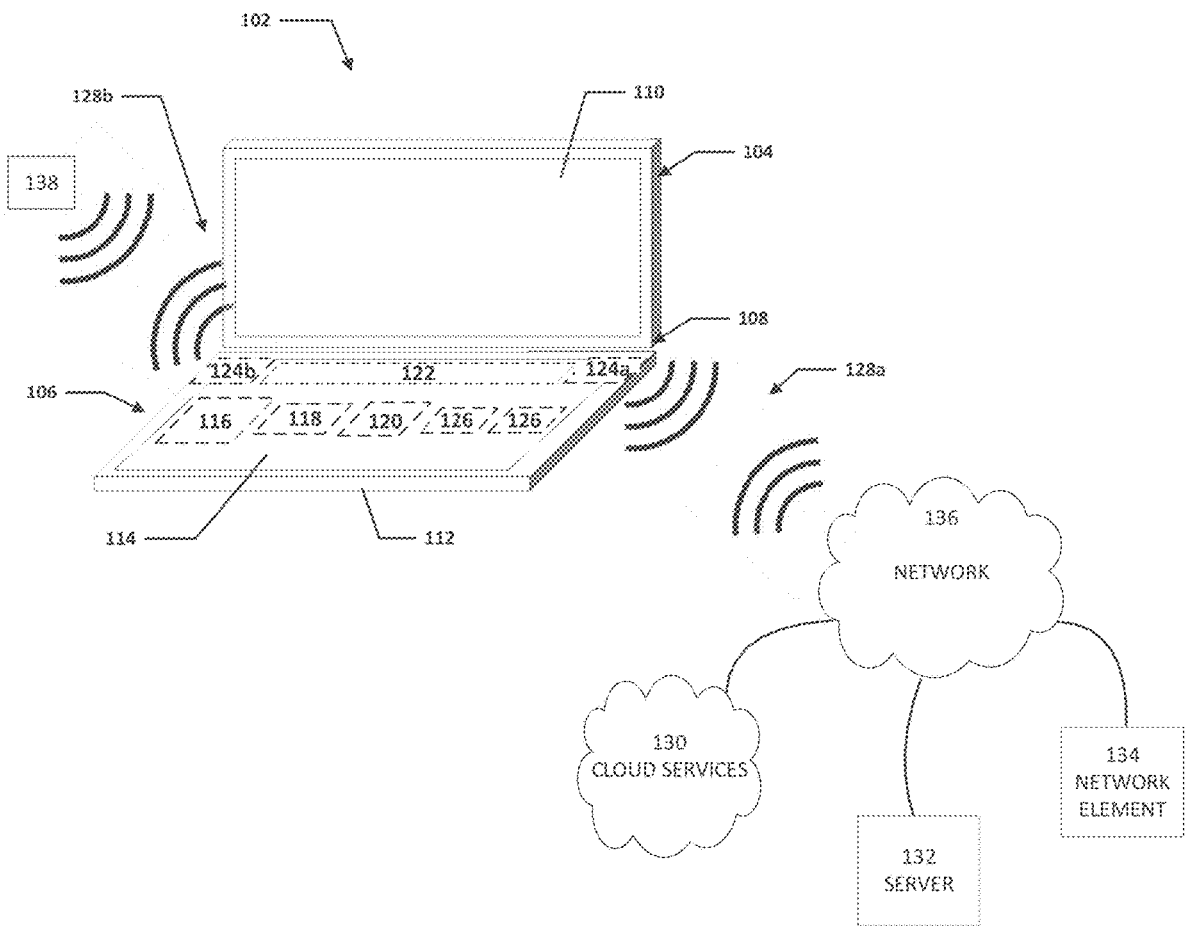
FIG. 1 is a simplified block diagram of a system to enable a transmission line embedded in a portion of a chassis of an electronic device, in accordance with an embodiment of the present disclosure.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling a transmission line embedded in a portion of a chassis of an electronic device. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer or component "directly on" or "directly under" a second layer or component is in direct contact with that second layer or component. Similarly, unless explicitly stated otherwise, one feature disposed between two features may be in direct contact with the adjacent features or may have one or more intervening layers.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. The appearances of the phrase "for example," "in an example," or "in some examples" are not necessarily all referring to the same example. The term "about" indicates a tolerance of twenty percent (10%). For example, about one (1) mm would include one (1) mm and ±0.1 mm from one (1) mm. Similarly, terms indicating orientation of various elements, for example, "coplanar," "perpendicular," "orthogonal," "parallel," or any other angle between the elements generally refer to being within plus or minus five to twenty percent (+/−5-20%) of a target value based on the context of a particular value as described herein or as known in the art.

FIG. 1 is a simplified block diagram of an electronic device configured with a transmission line embedded in a portion of a chassis of an electronic device, in accordance with an embodiment of the present disclosure. In an example, an electronic device 102 can include a first housing 104 and a second housing 106. The first housing 104 can be rotatively or pivotably coupled to the second housing 106 using a hinge 108. The first housing 104 can include a display 110. Electronic device 102 can be a laptop computer.

The second housing 106 can include a keyboard 114, memory 116, one or more processors 118, a wireless communication engine 120, a transmission line 122, one or more antenna 124 (e.g., FIG. 1 illustrates antenna 124a and antenna 124b), and one or more electronic components 126. Each of the electronic components 126 can be a device or group of devices available to assist in the operation or function of the electronic device 102. The second housing 106 can also include a chassis 112. The chassis 112 is the physical frame or structure that contains the power supply, motherboard, memory, disk drives and other components of electronic device 102. For example, as illustrated in FIG. 1, the chassis 112 is the physical frame or support structure for the keyboard 114, the memory 116, the one or more processors 118, the wireless communication engine 120, the transmission line 122, the one or more antenna 124, and the one or more electronic components 126 (e.g., battery, disk drives, etc.). The transmission line 122 can be embedded in the chassis 112 of the electronic device 102. In an example, the transmission line 122 is a conductive material and includes stainless steel, copper, an alloy such as nickel copper, or some material that is conductive, rigid, and can help guide RF energy from one point to another. In some examples, the transmission line 122 is a strip-line transmission line.

The electronic device 102 can be in wireless communication with one or more other devices using the wireless communication engine 120, the transmission line 122, and the one or more antenna 124. For example, as illustrated in FIG. 1, using the wireless communication engine 120, the transmission line 122, and the antenna 124a, the electronic device 102 can send and receive signal 128a and communicate with cloud service(s) 130, a server 132, and/or a network element 134 using a network 136. In addition, the electronic device 102, using the wireless communication engine 120, the transmission line 122, and the antenna 124b, can send and receive signal 128b and communicate with a wireless device 138. The wireless device 138 may be an Internet of Things (IoT) device, a Bluetooth® device, a WiFi enabled device, or some other device that can wirelessly communicate with electronic device 102. In some examples, the wireless device 138 can be in communication with the cloud service(s) 130, the server 132, and/or the network element 134 using the network 136. Generally, the transmission line 122 is a wireless communication transmission line. More specifically, the transmission line 122 is used to guide radio frequency (RF) energy from one point (e.g., the wireless communication engine 120) to another point (e.g., antenna 124). Each of the one or more antenna 124 are associated with the region of transition from a guided wave to a free space wave (e.g., signal 128a or 128b), radiating RF energy.

It is to be understood that other embodiments may be utilized and structural changes may be made without departing from the scope of the present disclosure. Substantial flexibility is provided in that any suitable arrangements and configuration may be provided without departing from the teachings of the present disclosure.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase function and performance. One current trend is thinner and lighter devices. To reduce the Z-height of some systems, the transmission lines for wireless signals are designed to have a relatively small diameter. (The term "Z-height," "Z location," etc. refers to the height along the "Z" axis of an (x, y, z) coordinate axis or cartesian coordinate system.) However, as the diameter of the transmission line is reduced, the insertion loss of the transmission line increases. This results in the need for a higher transmit power and that can impact the overall system power consumption. Also, the higher transmit power can increase the system noise.

Another current trend to increase the performance and function is to increase the density of the devices and systems and pack more computing elements into the devices and systems. However, the increase in computing elements causes an increase in the electromagnetic interference (EMI) and radio frequency interference (RFI). EMI and RFI affect almost every electronic device, especially mobile compute devices. As stated above, as the diameter of the transmission line is reduced to reduce the Z-height of the system, a higher transmit power is needed to compensate for the increased insertion loss of the transmission line and the higher transmit power can increase the system noise. What is needed is a transmission line that does not greatly increase the Z-height of the system and does not greatly increase the system noise to compensate for the insertion loss due to a relatively small diameter transmission line.

A transmission line, as outlined in FIG. 1, can resolve these issues (and others). In an example, a transmission line embedded in a portion of a chassis of an electronic device can help to decrease the overall thickness of the electronic device without greatly increasing the insertion loss of the transmission line or the signal noise of the system. In some examples, the transmission line embedded in a portion of the chassis can also help to reduce the system level routing complexity by helping to eliminate or reduce some of the challenges associated with system cable routing. The transmission line can be supported by a plurality of transmission line supports at periodic locations based on the length of the transmission line.

More specifically, in one example, the chassis of the electronic device can include a keyboard mounting plate and the transmission line can be imbedded in the keyboard mounting plate. A dielectric (e.g., air) can be located above and below the transmission line. In a specific example, the chassis of the electronic device can include a module mounting plate and the transmission line can be imbedded in the module mounting plate such that the module mounting plate can be used as the conductor for transmission line. The bottom side of a graphite layer under the keyboard and the bottom side of a substrate (e.g., a printed circuit board) for the electronic device can be used as the reference layers for the transmission line. The transmission line can be coupled to the module mounting plate using a plurality of transmission line supports that have a length, a width, and routing according to design specifications and functional requirements. In an example, the plurality of transmission line supports can be comprised of plastic, thermoplastic, thermoset, or some other non-conductive material that can support the transmission line. In a specific example, the plurality of transmission line supports can be comprised of nylon 30% glass filled or Teflon® and can be positioned at periodic locations based on the length of the transmission line.

Each end of the transmission line can be coupled to a transmission line coupling pad. In some examples, each end of the transmission line can have a hook or "C" shaped profile that can act as a metal spring to help enable the connection between the ends of the transmission line and the transmission line coupling pads. The transmission line coupling pads can help connect the transmission line to the wireless communication engine and to the antenna to help enable wireless communications.

Turning to the infrastructure of FIG. 1, network 136 represents a series of points or nodes of interconnected communication paths for receiving and transmitting packets of information. Network 136 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 136, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

In an example implementation, electronic device 102, is meant to encompass an electronic device that includes a transmission line to help allow the electronic device 102 to wirelessly communicate with another device or network. Electronic device 102 may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Electronic device 102 may include virtual elements.

In regards to the internal structure, electronic device 102 can include memory elements (e.g., memory 116) for storing information to be used in the operations outlined herein. Electronic device 102 may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions outlined herein may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for the operations described herein. This includes the memory elements being able to store software, logic, code, or processor instructions that are executed to carry out the activities described herein.

In an example implementation, electronic device 102 may include software modules (e.g., wireless communication engine 120, etc.) to achieve, or to foster, operations as outlined herein. These modules may be suitably combined in any appropriate manner, which may be based on particular configuration and/or provisioning needs. In example embodiments, such operations may be carried out by hardware, implemented externally to these elements, or included in some other device to achieve the intended functionality. Furthermore, the modules can be implemented as software, hardware, firmware, or any suitable combination thereof. These elements may also include software (or reciprocating software) that can coordinate with other network elements in order to achieve the operations, as outlined herein.

Additionally, electronic device 102 may include a processor (e.g., the one or more processors 118) that can execute software or an algorithm to perform activities as discussed herein. A processor can execute any type of instructions associated with the data to achieve the operations detailed herein. In one example, the processors could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Figure 2:
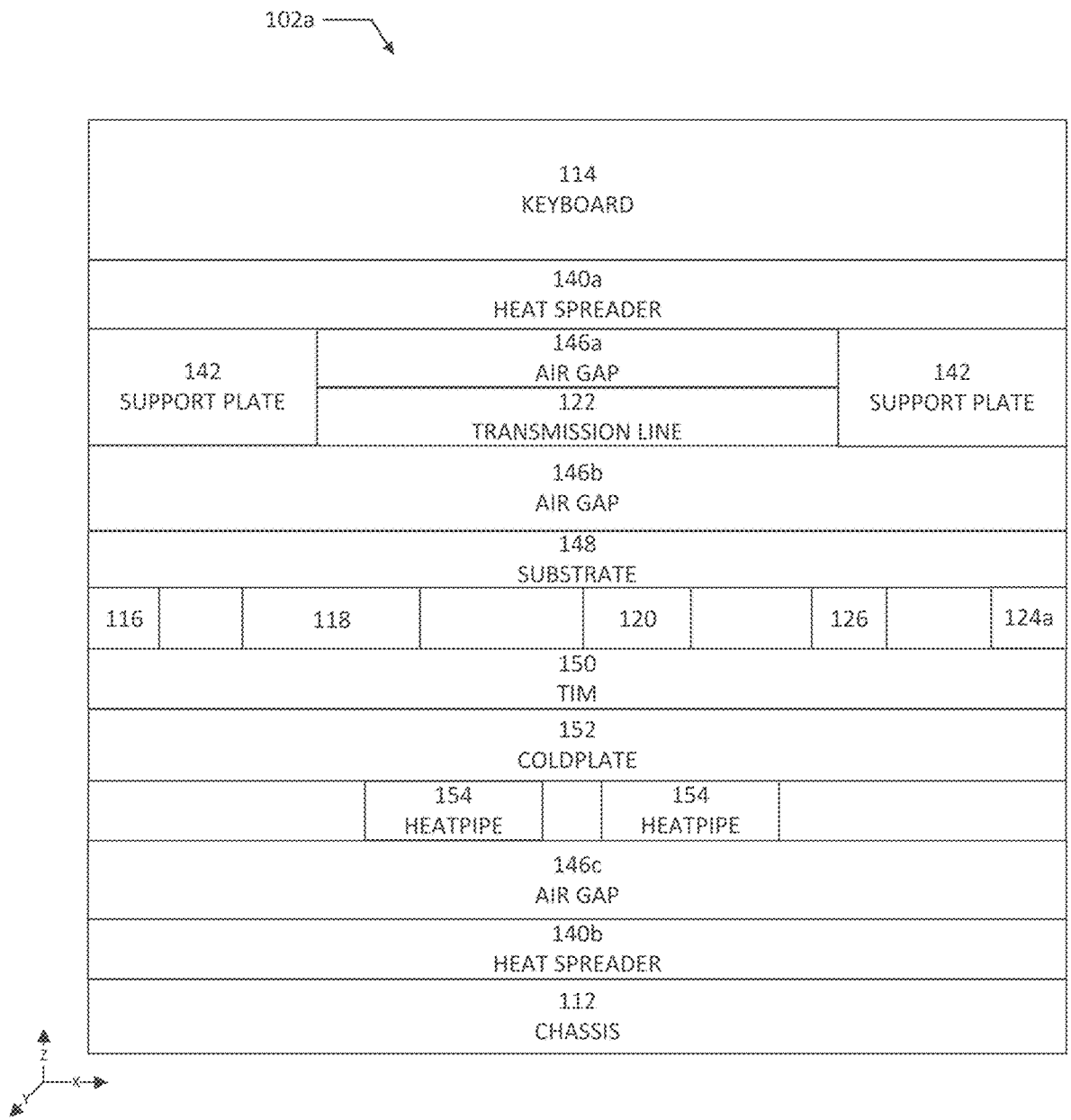
FIG. 2 is a simplified block diagram of a portion of a system to enable a transmission line embedded in a portion of a chassis of an electronic device, in accordance with an embodiment of the present disclosure.

Turning to FIG. 2, FIG. 2 is a simplified block diagram of a side cut away view of a portion of an electronic device 102a, in accordance with an embodiment of the present disclosure. In an example, the electronic device 102a can include the chassis 112, the keyboard 114, the memory 116, the one or more processors 118, the wireless communication engine 120, the antenna 124a, the transmission line 122, the one or more electronic components 126, heat spreaders 140a and 140b, a support plate 142, air gaps 146a-146c, a substrate 148, a thermal interface material (TIM) 150, a cold plate 152, and one or more heat pipes 154.

As illustrated in FIG. 2, the heat spreader 140a can be under the keyboard 114. The term "under" is a relative term used to refer to a relative position of one layer or component with respect to other layers or components. The support plate 142 and the transmission line 122 can be under the heat spreader 140a. The air gap 146a can be between the transmission line 122 and the support plate 142. The substrate 148 can be under the transmission line 122 and the support plate 142. The air gap 146b can be between the substrate 148 and the transmission line 122 and the support plate 142. The memory 116, the one or more processors 118, the wireless communication engine 120, the antenna 124a, and the electronic component 126 can be under the substrate 148. The TIM 150 can be under the memory 116, the one or more processors 118, the wireless communication engine 120, the antenna 124a, and the electronic component 126. The cold plate 152 can be under the TIM 150. The one or more heat pipes 154 can be under the cold plate 152. The heat spreader 140b can be under the one or more heat pipes 154 with the air gap 146c between the heat spreader 140b and the one or more heat pipes 154. The chassis 112 can be under the heat spreader 140b.

In an example, the keyboard 114 can be a mechanical keyboard or a digital keyboard. The heat spreader 140a can be an electrically conductive heat spreader and is comprised of graphite or some other material that can help at least partially thermally insulate the keyboard 114 from heat below the heat spreader 140a (e.g., the heat generated by the memory 116, the one or more processors 118, the wireless communication engine 120, the antenna 124a, and/or the electronic component 126). The support plate 142 can be part of the chassis 112 and can be comprised of aluminum, titanium, a magnesium alloy, copper, or some other type of metal or material that can function as a ground reference plane and help support the keyboard 114. The transmission line 122 can be comprised of stainless steel, copper, an alloy such as nickel copper, or some material that is conductive, rigid, and can help guide RF energy from one point to another. The air gap 146a can help provide a thermal insulating gap between the transmission line 122 and the heat spreader 140a. In addition, the air gap 146a can act as a dielectric for RF waves to help reduce insertion loss. The air gap 146b can help provide a thermal insulating gap between the transmission line 122 and the substrate 148. In addition, the air gap 146b can act as a dielectric for RF waves to help reduce insertion loss.

The substrate 148 can be a printed circuit board (PCB), system-on-a-chip (SoC) or some other substrate or support structure that can support the memory 116, the one or more processors 118, the wireless communication engine 120, the antenna 124a, and/or the electronic component 126. The substrate 148 may be a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate 148 may be formed are described here, any material that may serve as a foundation upon which a semiconductor device may be built falls within the spirit and scope of the embodiments disclosed herein.

The TIM 150 can be thermal grease, phase change material, gap filler, or any other material to transfer heat and bridge the interface between two or more solid surfaces (e.g., the memory 116, the one or more processors 118, the wireless communication engine 120, the antenna 124a, and/or the electronic component 126 and the cold plate 152). The cold plate 152 can be a heat spreader, heat transfer pedestal, or some other component that can help to transfer heat away from the memory 116, the one or more processors 118, the wireless communication engine 120, the antenna 124a and to the one or more heat pipes 154. Each of the one or more heat pipes 154 can be a heat pipe, vapor chamber, or some other component that can help to transfer heat away from the cold plate 152 (e.g., to an active heat spreader such as a fan or to a passive heat spreader). The air gap 146c can help provide an insulating gap between the one or more heat pipes 154 and the heat spreader 140b. The heat spreader 140b can be a conductive heat spreader and can be comprised of graphite or some other material that can help at least partially thermally insulate the chassis 112 from heat above the heat spreader 140b (e.g., the heat collected by the one or more heat pipes 154 and/or the heat from the memory 116, the one or more processors 118, the wireless communication engine 120, the antenna 124a, and/or the electronic component 126). The chassis 112 is part of the physical frame or structure of the electronic device 102a. The support plate 142 is part of the chassis 112.

The heat spreader 140 and the substrate 148 are grounded and act as the reference planes for the transmission line 122. In some examples, the transmission line 122 is an RF transmission line configured to help with RF communications. Also, the transmission line 122 may be a strip line and the heat spreader 140 is the top ground plane for the strip line and the substrate 148 is the bottom ground plate for the strip line. In addition, because the heat spreader 140 and the substrate 148 are grounded, they can be used as shielding to help counter EMI and/or RFI issues. More specifically, because the heat spreader 140 and the substrate 148 are grounded, they can be used as an EMI shield to help block the EMI radiation from the transmission line 122.

Figure 3:
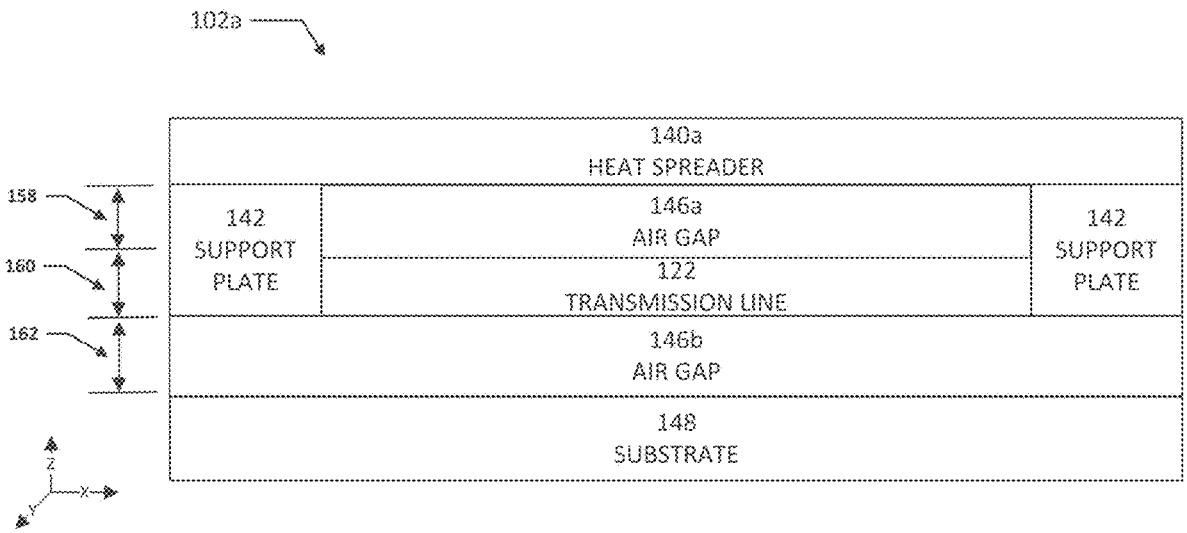
FIG. 3 is a simplified block diagram of a portion of a system to enable a transmission line embedded in a portion of a chassis of an electronic device, in accordance with an embodiment of the present disclosure.

Turning to FIG. 3, FIG. 3 is a simplified block diagram of a side cut away view of a portion of the electronic device 102a, in accordance with an embodiment of the present disclosure. In an example, the electronic device 102a can include the transmission line 122, the heat spreader 140a, the support plate 142, the air gaps 146a and 146b, and the substrate 148.

As illustrated in FIG. 3, the air gap 146a between the transmission line 122 and the heat spreader 140a can have a first air gap height 158. For a transmission line 122 with a width of about 1 mm, the first air gap height 158 may be between about 0.6 millimeters and about 0.20 millimeters and ranges therein (e.g., between about 0.5 and about 0.3 millimeters, or between about 0.4 and about 0.25 millimeters), depending on design choice and design constraints. In other examples, other transmission lines 122 with other widths may have other ranges, depending on design choice and design constraints. In a specific example, the first air gap height 158 is greater than or equal to about 0.15 millimeters. In another specific example, the first air gap height 158 may be about 0.35 millimeters.

The air gap 146b between the transmission line 122 and the substrate 148 can have a second air gap height 162. For a transmission line 122 with a width of about one (1) mm, the second air gap height 162 may be between about 0.6 millimeters and about 0.20 millimeters and ranges therein (e.g., between about 0.35 and about 0.2 millimeters, or between about 0.5 and about 0.4 millimeters), depending on design choice and design constraints. In a specific example, the second air gap height 162 is greater than or equal to about 0.15 millimeters. In another specific example, the second air gap height 162 may be about 0.3 millimeters. The transmission line 122 may have a transmission line height 160. The transmission line height 160 may be between about 0.5 millimeters and about 0.2 millimeters and ranges therein (e.g., between about 0.4 and about 0.25 millimeters, or between about 0.45 and about 0.3 millimeters), depending on design choice and design constraints. In a specific example, the transmission line height 160 may be greater than or equal to about 0.1 millimeters. Based on the first air gap height 158, (the air gap 146a between the transmission line 122 and the heat spreader 140a), the second air gap height 162, (the air gap 146b between the transmission line 122 and the substrate 148), and a defined impedance for the transmission line 122, the transmission line height 160 for the transmission line 122 can be determined.

Figure 4:
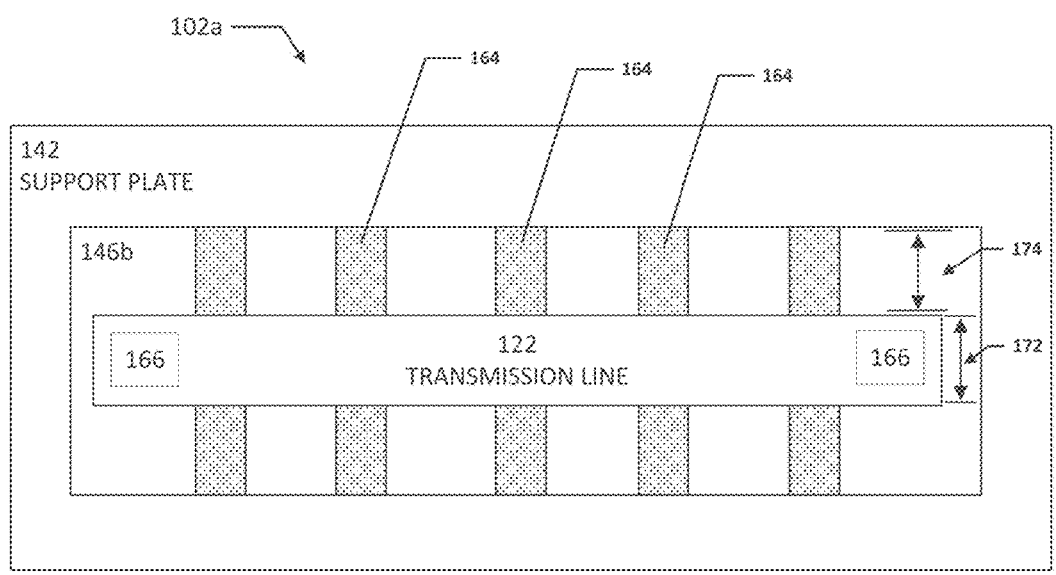
FIG. 4 is a simplified block diagram of a portion of a system to enable a transmission line embedded in a portion of a chassis of an electronic device, in accordance with an embodiment of the present disclosure.

Turning to FIG. 4, FIG. 4 is a simplified block diagram of a cut away top-down view of a portion of the electronic device 102a, in accordance with an embodiment of the present disclosure. The electronic device 102a can include the transmission line 122, the support plate 142, the air gap 146b, a plurality of transmission line supports 164, and transmission line coupling pads 166. The plurality of transmission line supports 164 help to support the transmission line 122 and can be comprised of plastic or some other non-conductive material. In a specific example, the plurality of transmission line supports 164 can be comprised nylon or Teflon®. As illustrated in FIG. 4, the plurality of transmission line supports 164 are relatively parallel to each other and are relatively perpendicular to the transmission line 122. The transmission line coupling pads 166 help to allow the transmission line 122 to send and receive signals from the wireless communication engine 120 and the one or more antenna 124.

As illustrated in FIG. 4, the transmission line 122 can have a transmission line width 172. In addition, an air gap distance 174 represents the distance from an outside edge of the transmission line 122 to an inside edge of the support plate 142. The transmission line width 172 depends on design choice and design constraints. In a specific example, the transmission line width 172 can be about one (1) mm. The air gap distance 174 also depends on design choice and design constraints. In a specific example, the air gap distance 174 can be greater than or equal to about 1.5 mm. The first air gap height 158, the transmission line height 160, and/or the second air gap height 162 illustrated in FIG. 3 and/or the transmission line width 172 and/or the air gap distance 174 can each be adjusted relative to each other, depending on design choice and design constraints, to achieve a desired impedance of the transmission line 122 for wireless communication. In addition, the material that comprises the transmission line 122 and/or the plurality of transmission line supports 164 can be selected to help achieve the desired impedance of the transmission line 122 for wireless communication.

Figure 5:
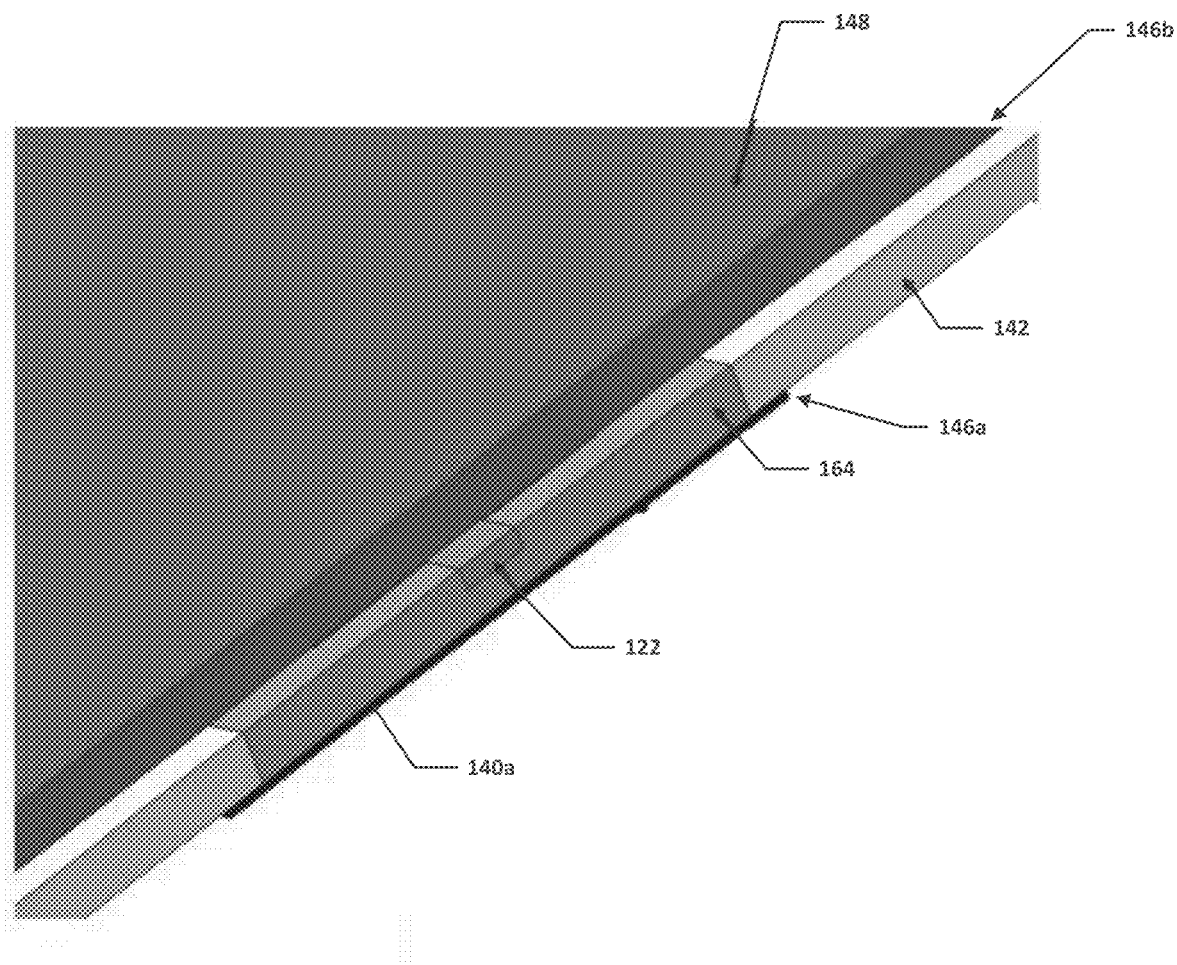
FIG. 5 is a simplified perspective view of a portion of a system to enable a transmission line embedded in a portion of a chassis of an electronic device, in accordance with an embodiment of the present disclosure.

Turning to FIG. 5, FIG. 5 is a simplified block diagram of a perspective view of a portion of the electronic device 102a, in accordance with an embodiment of the present disclosure. As illustrated in FIG. 5, the electronic device 102a can include the transmission line 122, the heat spreader 140a, the support plate 142, the air gaps 146a and 146b, and transmission line supports 164. Note that only a portion of one of the plurality of transmission line supports 164 is illustrated in FIG. 5. Also note that the portion of electronic device 102a illustrated in FIG. 5 is inverted comparted to the portion of electronic device 102a illustrated in FIGS. 2 and 3.

Figure 6:
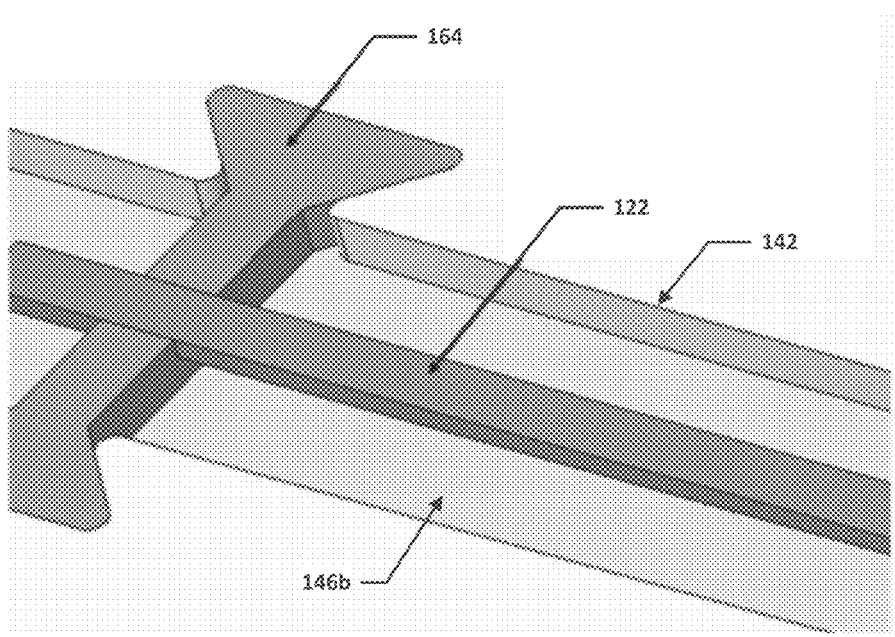
FIG. 6 is a simplified perspective view of a portion of a system to enable a transmission line embedded in a portion of a chassis of an electronic device, in accordance with an embodiment of the present disclosure.

Turning to FIG. 6, FIG. 6 is a simplified block diagram of a perspective view of a portion of the electronic device 102a, in accordance with an embodiment of the present disclosure. As illustrated in FIG. 6, the electronic device 102a can include the transmission line 122, the support plate 142, the air gap 146b, and the transmission line supports 164. Note that only one of the plurality of transmission line supports 164 is illustrated in FIG. 6. Also note that the coupling of the transmission line support 164 to the support plate 142 illustrated in FIG. 6 is for illustration purposes only and other means, mechanisms, configurations may be used to couple the plurality of transmission line supports 164 to the support plate 142.

Figure 7:
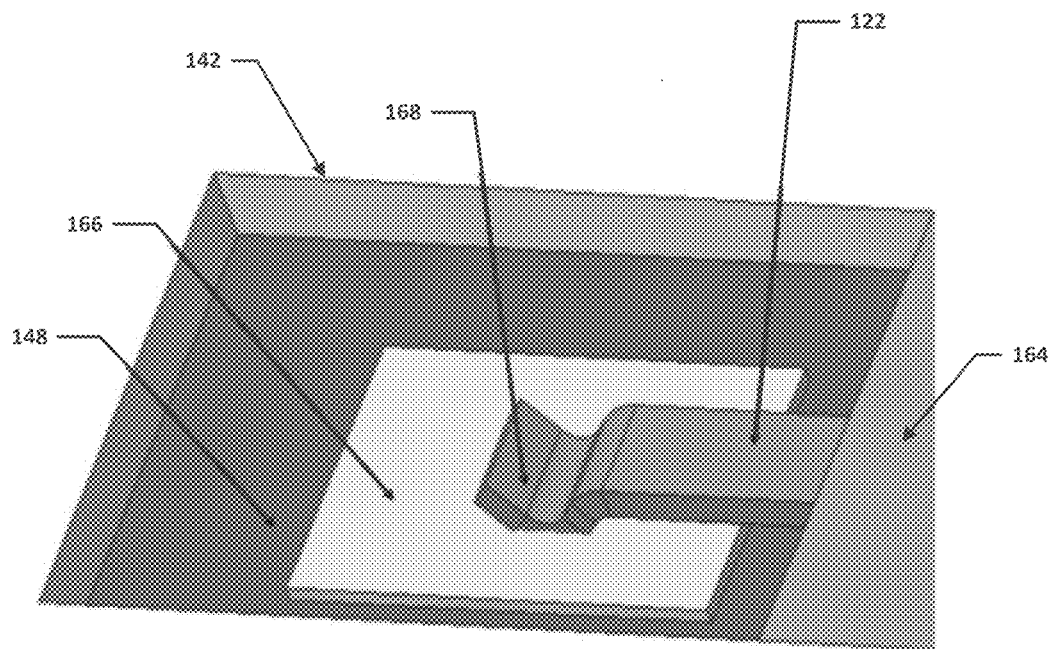
FIG. 7 is a simplified block diagram of a portion of a system to enable a transmission line embedded in a portion of a chassis of an electronic device, in accordance with an embodiment of the present disclosure.

Turning to FIG. 7, FIG. 7 is a simplified block diagram of a perspective view of a portion of the electronic device 102a, in accordance with an embodiment of the present disclosure. As illustrated in FIG. 7, the electronic device 102a can include the transmission line 122, the support plate 142, the substrate 148, the transmission line supports 164 and the transmission line coupling pad 166. Note that only a portion of one of the plurality of transmission line supports 164 is illustrated in FIG. 7. In an example, a coupling end 168 of the transmission line 122 that couples with the transmission line coupling pad 166 can have a hook or general "C" shaped profile to help allow the transmission line 122 to couple with the transmission line coupling pad 166. While the coupling end 168 of the transmission line 122 is illustrated as having a hook or general "C" shaped profile in FIG. 7, other profiles, configurations, means, mechanisms may be used to help allow the transmission line 122 couple with the transmission line coupling pad 166.

Figure 8:
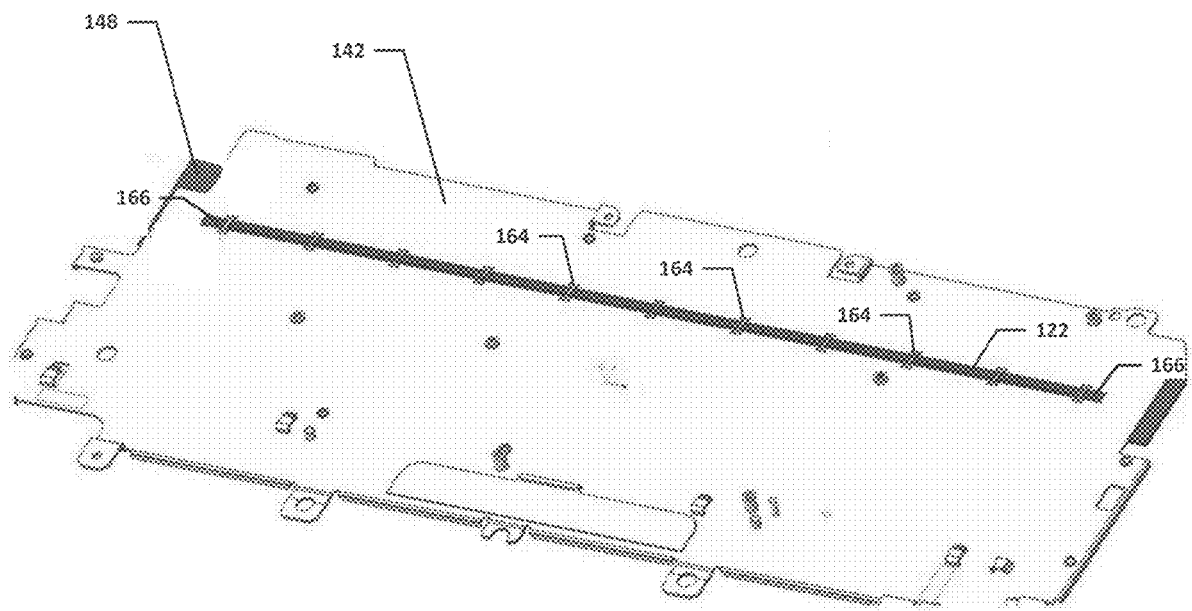
FIG. 8 is a simplified perspective view of a portion of a system to enable a transmission line embedded in a portion of a chassis of an electronic device, in accordance with an embodiment of the present disclosure.

Turning to FIG. 8, FIG. 8 is a simplified block diagram of a perspective view of a portion of the electronic device 102*a*, in accordance with an embodiment of the present disclosure. As illustrated in FIG. 8, the electronic device 102*a* can include the transmission line 122, the support plate 142, the substrate 148, the transmission line supports 164, and the transmission line coupling pad 166. As illustrated in FIG. 8, the support plate 142 is a support plate for a keyboard (e.g., keyboard 114). While the transmission line 122 has been illustrated as being located in the support plate 142, the transmission line 122 can be located in other portions of the chassis 112 depending on design constraints (e.g., a dielectric above and below the transmission line 122) and the desired functionality of the transmission line 122.

Figure 9:
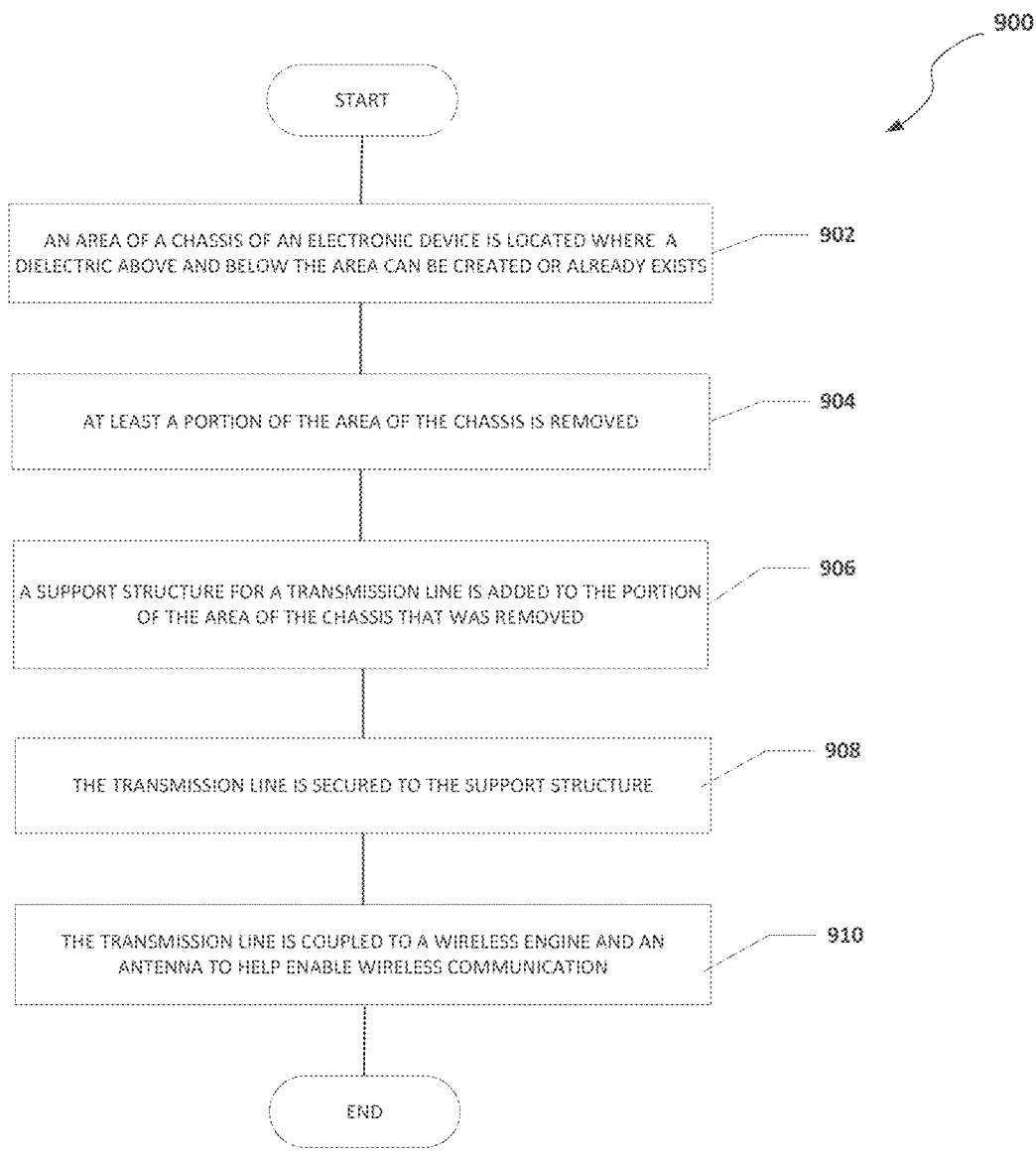
FIG. 9 is a simplified flowchart illustrating potential operations that may be associated with the system in accordance with an embodiment of the present disclosure.

Turning to FIG. 9, FIG. 1*s* an example flowchart illustrating possible operations of a flow 900 that may be associated with a transmission line embedded in a portion of a chassis of an electronic device, in accordance with an embodiment. At 902, an area of a chassis of an electronic device is located where a dielectric above and below the area can be created or already exists. For example, the support plate 142 is an area of the chassis 112 of the electronic device 102*a* where a dielectric, (air gap 146*a* and air gap 146*b*), above and below the area can be created or already exists. At 904, at least a portion of the area of the chassis is removed. For example, the area of the chassis can be removed by stamping the area, milling the area, chemical etching, laser etching, or by some other means of removing an area of a chassis. At 906, a support structure for a transmission line is added to the portion of the area of the chassis that was removed. For example, the transmission line supports 164 can be added to the portion of the area of the chassis that was removed. At 908, the transmission line is secured to the support structure. For example, the transmission line can be secured to the transmission line supports as illustrated in FIG. 4 and/or FIG. 6 or by some other means to embed the transmission line in a portion of the chassis. At 910, the transmission line is coupled to a wireless engine and antenna to help enable wireless communication. For example, the transmission line can be coupled to the transmission line coupling pad 166 to allow the transmission line 122 to send and receive signals from the wireless communication engine 120 and antenna 124 to help enable wireless communication.

Figure 10:
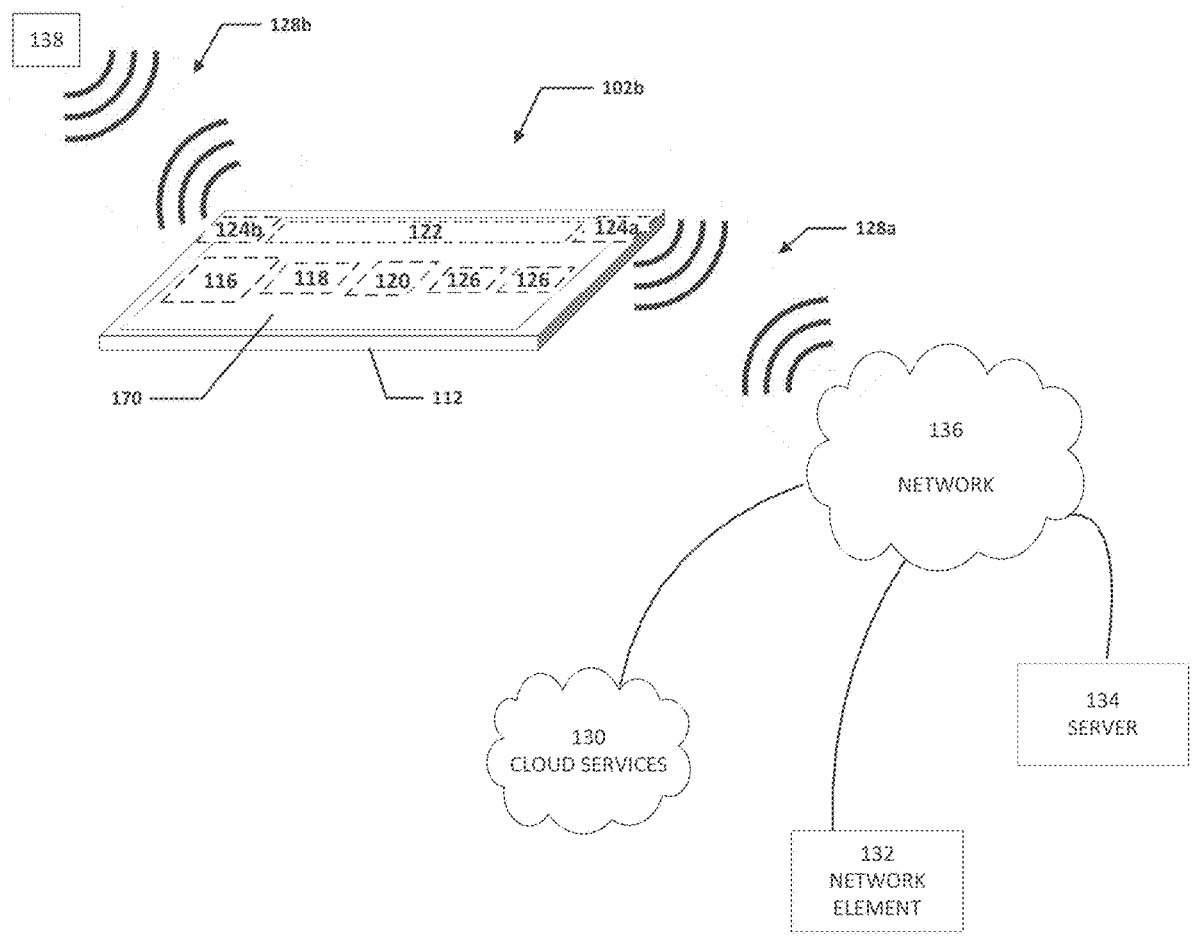
FIG. 10 is a block diagram illustrating an example device that include a transmission line embedded in a portion of a chassis of an electronic device, in accordance with an embodiment of the present disclosure.

Turning to FIG. 10, FIG. 10 is a simplified block diagram of an electronic device configured with a transmission line embedded in a portion of a chassis of an electronic device 102*b*, in accordance with an embodiment of the present disclosure. In an example, the electronic device 102*b* may be a tablet computer or some other wireless communication device with a single housing (e.g., smartphone, IoT device, etc.). As illustrated in FIG. 10, the electronic device 102*b* can include the memory 116, the one or more processors 118, the wireless communication engine 120, the transmission line 122, the one or more antenna 124 (e.g., FIG. 10 illustrates antenna 124*a* and antenna 124*b*), the one or more electronic components 126, and a single housing device display 170. Each of the electronic components 126 can be a device or group of devices available to assist in the operation or function of the electronic device 102*b*. The electronic device 102*b* can also include the chassis 112. The chassis 112 is the physical frame or structure that contains the power supply, motherboard, memory, disk drives, display, and other components of electronic device 102*b*. For example, as illustrated in FIG. 10, the chassis 112 is the physical frame or structure for the memory 116, the one or more processors 118, the wireless communication engine 120, the transmission line 122, the one or more antenna 124, the one or more electronic components 126 (e.g., battery, disk drives, etc.), and the single housing device display 170. The transmission line 122 can be embedded in the chassis 112 of the electronic device 102*b* in an area where a dielectric (e.g., an air gap) above and below the transmission line exists or can be created.

The electronic device 102*b* can be in wireless communication with one or more other devices using the wireless communication engine 120, the transmission line 122, and the one or more antenna 124. For example, as illustrated in FIG. 10, using the wireless communication engine 120, the transmission line 122, and the antenna 124*a*, the electronic device 102*b* can send and receive signal 128*a* and communicate with the cloud service(s) 130, the server 132, and/or the network element 134 using the network 136. In addition, using the wireless communication engine 120, the transmission line 122, and the antenna 124*b*, the electronic device 102*b* can send and receive signal 128*b* and communicate with the wireless device 138.

Elements of FIG. 10 may be coupled to one another through one or more interfaces employing any suitable connections (wired or wireless), which provide viable pathways for network (e.g., network 136, etc.) communications. Additionally, any one or more of these elements of FIG. 10 may be combined or removed from the architecture based on particular configuration needs. Network 136 may include a configuration capable of transmission control protocol/Internet protocol (TCP/IP) communications for the transmission or reception of packets in a network. Electronic device 102*b* may also operate in conjunction with a user datagram protocol/IP (UDP/IP) or any other suitable protocol where appropriate and based on particular needs. Each of electronic devices 102, 102*a*, and 102*b* may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Each of electronic devices 102, 102*a*, and 102*b* may include virtual elements.

Note that with the examples provided herein, interaction may be described in terms of two, three, or more elements. However, this has been done for purposes of clarity and example only. In certain cases, it may be easier to describe one or more of the functionalities of a given set of flows by only referencing a limited number of elements. It should be appreciated that electronic devices 102, 102*a*, and 102*b* and their teachings are readily scalable and can accommodate a large number of components, as well as more complicated/sophisticated arrangements and configurations. Accordingly, the examples provided should not limit the scope or inhibit the broad teachings of electronic devices 102, 102*a*, and 102*b* and as potentially applied to a myriad of other architectures.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although electronic devices 102a-102d have been illustrated with reference to particular elements and operations, these elements and operations may be replaced by any suitable architecture, protocols, and/or processes that achieve the intended functionality of electronic devices 102, 102a, and 102b.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES AND EXAMPLES

In Example A1, is a mobile computing device configured for radio frequency communication, the mobile computing device including a substrate, a keyboard, a chassis, where a portion of the chassis is between the substrate and the keyboard, and a transmission line embedded in the portion of the chassis between the substrate and the keyboard.

In Example A2, the subject matter of Example A1 can optionally include where the portion of the chassis between the substrate and the keyboard is a support plate for the keyboard.

In Example A3, the subject matter of any one of Examples A1-A2 can optionally include where a first air gap between the transmission line and the keyboard and a second air gap between the transmission line and the substrate.

In Example A4, the subject matter of any one of Examples A1-A3 can optionally include where the first air gap and the second air gap are a dielectric for radio frequency waves emitted from the transmission line.

In Example A5, the subject matter of any one of Examples A1-A4 can optionally include a heat spreader between the transmission line and the keyboard.

In Example A6, the subject matter of any one of Examples A1-A5 can optionally include where the heat spreader and substrate are grounded and create an electromagnetic interference shield.

In Example A7, the subject matter of any one of Examples A1-A6 can optionally include where the radio frequency communication is WiFi.

In Example A8, the subject matter of any one of Examples A1-A7 can optionally include where the transmission line is a strip line.

Example AA1 is an electronic device including a substrate, memory on the substrate, one or more processors on the substrate, a keyboard, a chassis, where a portion of the chassis is between the substrate and the keyboard, a transmission line embedded in the portion of the chassis between the substrate and the keyboard, and one or more antenna.

In Example AA2, the subject matter of Example AA1 can optionally include where the transmission line is a wireless communication transmission line.

In Example AA3, the subject matter of any one of Examples AA1-AA2 can optionally include where the portion of the chassis between the substrate and the keyboard is a support plate for the keyboard.

In Example AA4, the subject matter of any one of Examples AA1-AA3 can optionally include a first dielectric and a second dielectric, where the transmission line is between the first dielectric and the second dielectric.

In Example AA5, the subject matter of any one of Examples AA1-AA4 can optionally include a first air gap between the transmission line and the keyboard and a second air gap between the transmission line and the substrate.

In Example AA6, the subject matter of any one of Examples AA1-AA5 can optionally include a plurality of transmission line supports coupled to the portion of the chassis between the substrate and the keyboard to support the transmission line.

In Example AA7, the subject matter of any one of Examples AA1-AA7 can optionally include a plurality of transmission line supports comprised of non-conductive material.

In Example AA8, the subject matter of any one of Examples AA1-AA7 can optionally include where the transmission line is a strip line.

In Example AA9, the subject matter of any one of Examples AA1-AA8 can optionally include transmission line coupling pads to couple the transmission line to the antenna and a wireless communication engine.

Example M1 is a method including identifying an area of a chassis of an electronic device where a dielectric above and below the area can be created or already exists, removing at least a portion of the area of the chassis where a dielectric above and below the area can be created or already exists, adding a support structure for a transmission line to the portion of the area of the chassis that was removed, and securing the transmission line to the support structure.

In Example M2, the subject matter of Example M1 can optionally include coupling the transmission line to a wireless communication engine and coupling the transmission line to one or more antenna.

In Example M3, the subject matter of any one of the Examples M1-M2 can optionally include where the transmission line is a strip line.

What is claimed is:

1. A mobile computing device configured for radio frequency communication, the mobile computing device comprising:
    a substrate;
    memory on the substrate;
    one or more processors on the substrate;
    a keyboard;
    a chassis, wherein a portion of the chassis is between the substrate and the keyboard; and
    a transmission line embedded in the portion of the chassis between the substrate and the keyboard.

2. The mobile computing device of claim 1, wherein the portion of the chassis between the substrate and the keyboard is a support plate for the keyboard.

3. The mobile computing device of claim 1, further comprising:
    a first air gap between the transmission line and the keyboard; and
    a second air gap between the transmission line and the substrate.

4. The mobile computing device of claim 3, wherein the first air gap and the second air gap are a dielectric for radio frequency waves emitted from the transmission line.

5. The mobile computing device of claim 1, further comprising:
a heat spreader between the transmission line and the keyboard.

6. The mobile computing device of claim 5, wherein the heat spreader and substrate are grounded and create an electromagnetic interference shield.

7. The mobile computing device of claim 1, wherein the radio frequency communication is WiFi.

8. The mobile computing device of claim 1, wherein the transmission line is a strip line.

9. An electronic device comprising:
a substrate;
memory on the substrate;
one or more processors on the substrate;
a keyboard;
a chassis, wherein a portion of the chassis is between the substrate and the keyboard;
a transmission line embedded in the portion of the chassis between the substrate and the keyboard; and
one or more antennas.

10. The electronic device of claim 9, wherein the transmission line is a wireless communication transmission line.

11. The electronic device of claim 9, wherein the portion of the chassis between the substrate and the keyboard is a support plate for the keyboard.

12. The electronic device of claim 9, further comprising:
a first dielectric; and
a second dielectric, wherein the transmission line is between the first dielectric and the second dielectric.

13. The electronic device of claim 9, further comprising:
a first air gap between the transmission line and the keyboard; and
a second air gap between the transmission line and the substrate.

14. The electronic device of claim 9, further comprising:
a plurality of transmission line supports coupled to the portion of the chassis between the substrate and the keyboard to support the transmission line.

15. The electronic device of claim 14, wherein the plurality of transmission line supports are comprised of non-conductive material.

16. The electronic device of claim 9, wherein the transmission line is a strip line.

17. The electronic device of claim 9, further comprising:
transmission line coupling pads to couple the transmission line to the antenna and a wireless communication engine.

18. A method, comprising:
providing a substrate, memory on the substrate, and one or more processors on the substrate;
removing at least a portion of an area of a chassis where a dielectric above and below the area can be created or already exists;
adding a support structure for a transmission line to the portion of the area of the chassis that was removed; and
securing the transmission line to the support structure.

19. The method of claim 18, further comprising:
coupling the transmission line to a wireless communication engine; and
coupling the transmission line to one or more antenna.

20. The method of claim 18, wherein the transmission line is a strip line.

* * * * *